United States Patent [19]

Jelinek

[11] Patent Number: 5,302,861
[45] Date of Patent: Apr. 12, 1994

[54] POWER ON RESET CIRCUIT WITH SHARPLY SLOPED VOLTAGE TRANSFER FUNCTION

[75] Inventor: Jules J. Jelinek, San Francisco, Calif.

[73] Assignee: National Semiconductor Corporation, Santa Clara, Calif.

[21] Appl. No.: 981,883

[22] Filed: Nov. 25, 1992

[51] Int. Cl.[5] .................................................. H03K 17/22
[52] U.S. Cl. ................................ 307/296.5; 307/272.3; 307/296.4; 307/362
[58] Field of Search ............. 307/272.3, 296 A, 296.5, 307/350, 354, 360, 362, 363

[56] References Cited

U.S. PATENT DOCUMENTS

| | | | |
|---|---|---|---|
| 4,048,524 | 9/1977 | Laugesen et al. | 307/360 |
| 4,309,627 | 1/1982 | Tabata | 307/362 |
| 4,634,905 | 1/1987 | Campbell, Jr. | 307/354 |
| 4,888,498 | 12/1989 | Kadakia | 307/296.4 |
| 5,016,222 | 5/1991 | Hashimoto | 307/296.5 |
| 5,144,159 | 9/1992 | Frisch et al. | 307/272.3 |

FOREIGN PATENT DOCUMENTS

| | | | |
|---|---|---|---|
| 0154365 | 12/1979 | Japan | 307/272.3 |
| 0024123 | 2/1982 | Japan | 307/272.3 |
| 0154520 | 6/1990 | Japan | 307/272.3 |

*Primary Examiner*—William L. Sikes
*Assistant Examiner*—Terry D. Cunningham
*Attorney, Agent, or Firm*—Flehr, Hohbach, Test, Albritton & Herbert

[57] ABSTRACT

A power on reset circuit that incorporates a voltage divider, and current reference generator and a switching circuit. The voltage divider generates an output voltage which is a predefined fraction of the supply voltage. The current reference generator generates a reference current which controls a first current mirror in the switching circuit. The switching circuit, which has a sharply sloped voltage transfer characteristic, includes a first transistor that is gated by the voltage divider output and coupled to the first current mirror at a first circuit node. The first transistor draws current from the first current mirror only when the voltage divider output exceeds a threshold voltage, causing the switching circuit to develop a first reset voltage on the first circuit node. The power on reset circuit may also include an inverter having an input coupled to the first circuit node and producing a second reset voltage on a second circuit node. The inverter comprises a current mirror coupled to the current reference generator and a transistor gated by the first reset voltage and coupled the to current mirror at the second circuit node to draw current from the current mirror only when the first reset voltage exceeds the threshold voltage. Additionally, the power on reset circuit may include various types of filters coupled to the voltage divider output and/or the first circuit node to suppress noise in the voltage supply.

8 Claims, 2 Drawing Sheets

POWER ON RESET CIRCUIT WITH SHARPLY SLOPED VOLTAGE TRANSFER FUNCTION

The present invention relates generally to circuits that generate a distinctive signal when an integrated circuit is powered on, and particularly to a circuit that produces a reset signal based solely on the power supply voltage.

BACKGROUND OF THE INVENTION

Most prior art power on reset circuits produce a reset signal using time delay schemes. For instance, a time delay circuit could be used to generate a reset signal a certain number of microseconds after the circuit is powered on.

It is an object of the present invention to provide a power on reset circuit with a very sharp voltage transfer function, such that a reset signal is generated when, and only when, the power supply voltage exceeds a specified voltage level.

SUMMARY OF THE INVENTION

In summary, the present invention is a power on reset circuit that incorporates a voltage divider, and current reference generator and a switching circuit. The voltage divider generates an output voltage which is a predefined fraction of the supply voltage. The current reference generator generates a reference current which controls a first current mirror in the switching circuit. The switching circuit, which has a sharply sloped voltage transfer characteristic, includes a first transistor that is gated by the voltage divider output and coupled to the first current mirror at a first circuit node. The first transistor draws current from the first current mirror only when the voltage divider output exceeds a threshold voltage, causing the switching circuit to develop a first reset voltage on the first circuit node.

The power on reset circuit may also include an inverter having an input coupled to the first circuit node and producing a second reset voltage on a second circuit node. The inverter preferably includes a second current mirror coupled to the current reference generator and a second transistor gated by the first reset voltage and coupled to the second current mirror at the second circuit node. The second transistor draws current from the second current mirror only when the first reset voltage exceeds the threshold voltage.

Additionally, the power on reset circuit may include various types of filters coupled to the voltage divider output and/or the first circuit node to suppress or filter noise in the voltage supply.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 1:
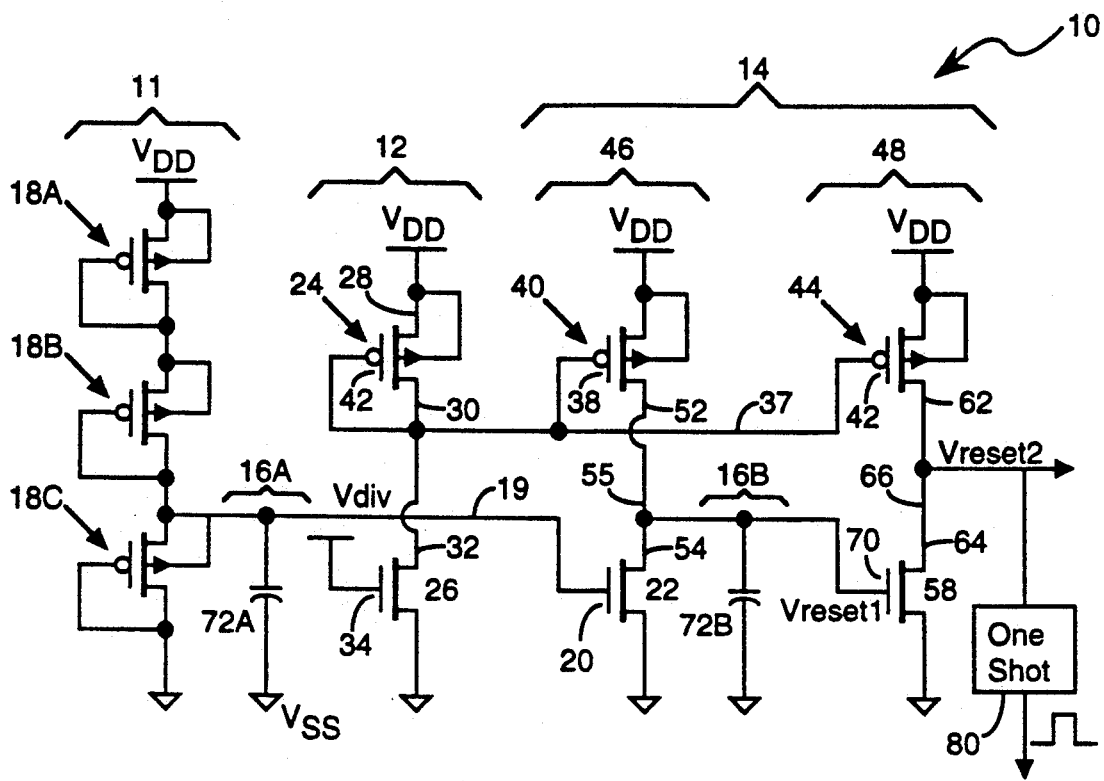
FIG. 1 is a circuit diagram of a preferred embodiment of the invention.

Referring to FIG. 1, there is shown a preferred embodiment of a power on reset circuit. As shown, the power on reset circuit 10 employs a voltage divider 11, a reference current generator 12, a switching circuit 14, and first and second noise filters 16A and 16B. Switching circuit 14 is coupled to the outputs of both voltage divider 11 and reference current generator 12. First noise filter 16A is coupled between voltage divider 11 and switching circuit 14, and second noise filter 16B is coupled within switching circuit 14.

Voltage divider 11 is formed by three p-channel transistors 18A, 18B, and 18C connected in series, which divides a supply voltage $V_{DD}$ by three. Other components such as resistors may be used to form the voltage divider 11, but the series connected p-channel transistors are more space efficient. The output of voltage divider 11, on node 19, is coupled to switching circuit 14 at gate 20 of a first n-channel transistor 22.

The power on reset circuit in FIG. 1 has a very sharp voltage transfer function, such that a reset signal is generated when, and only when, the power supply voltage exceeds a specified voltage level. In the preferred embodiment the voltage level at which the reset signal is generated is 3 $V_T$, where $V_T$ is the threshold voltage of the N-channel MOS transistors in the circuit. In industry standard MOS, CMOS and BiCMOS integrated circuits $V_T$ typically is set somewhere between 0.75 and 1.1 volts. In the preferred embodiment, the manufacturing process is designed so that the threshold voltage of the N-channel MOS transistors is approximately 1.1 volts, and therefore the trigger voltage at which the reset signal is generated is approximately 3.3 volts.

As will be understood by those skilled in the art, the voltage levels used as examples in this description are for average temperature and average circuit manufacturing process conditions. A "window" of trigger voltages will result due to manufacturing induced process variations and environmental operating conditions such as temperature differences.

The preferred embodiment of the invention assumes that the voltage supply when fully turned on will be no less than 4 volts, with a nominal value of 5 volts. For circuits with higher or lower voltage supply levels, the voltage divider ladder would have to be adjusted accordingly so as to output a divided triggering voltage Vdiv on node 19 at an appropriate voltage level.

Current reference generator 12 is formed by p-channel transistor 24 and n-channel transistor 26. The source 28 of p-channel transistor 24 is connected to supply voltage $V_{DD}$ and drain 30 is connected to drain 32 of n-channel transistor 26. The gate 34 of n-channel transistor 26 is connected to the supply voltage $V_{DD}$ and its source is connected to the circuit ground $V_{SS}$. The output of reference current generator 12, on node 37, is coupled to switching circuit 14 at gate 38 of first current mirror 40 and gate 42 of second current mirror 44.

Switching circuit 14 is formed by a first inverter 46 and a second inverter 48. The first inverter 46 is a high gain inverter that includes first current mirror 40 and a first n-channel transistor 22. The gate 42 of first current mirror 40 is connected to the output of reference current generator 12. The source 50 of first current mirror 40 is connected to supply voltage $V_{DD}$. The drain 52 of first current mirror 40 is connected to drain 54 of first n-channel transistor 22 at first node 55. The source of first n-channel transistor 22 is connected to circuit ground $V_{SS}$, and first n-channel transistor 22 is gated at gate 20 to the output of voltage divider 11 on node 19.

Second inverter 48 is similar to the first inverter and includes second current mirror 44 and second n-channel transistor 58. The gate 42 of second current mirror 44 is connected to the output of reference current generator 12. The source of second current mirror 44 is connected to supply voltage $V_{DD}$. The drain 62 of second current mirror 44 is connected to drain 64 of second n-channel transistor 58 via second node 66. The source of second n-channel transistor 58 is connected to circuit ground $V_{SS}$ and the gate 70 of transistor 58 is connected to the output of first inverter 46 via first node 55.

Transistors 40 and 22 are sized so that the output of the first inverter on node 55 transitions sharply from high to low when the voltage on the gate 20 of transistor 22 rises above its threshold voltage. Similarly, transistors 44 and 58 are sized so that the output of the second inverter on node 66 transitions sharply from high to low when the voltage on the gate 70 of transistor 58 rises above its threshold voltage. More particularly, the voltage transition characteristic of inverters 46 and 48 are based on the drive ratio (or transistor size) of transistors 22 and 58, respectively, to transistor 26 in the current reference source 22. That is, the larger the transistor drive ratio is made (by defining the sizes of transistors 22 and 58), the sharper the voltage transfer function will be.

First noise filter 16A is coupled to node 19 between the output of voltage divider 11 and gate 20 of first n-channel transistor 22. Also, second noise filter 16B is coupled to node 55 in switching circuit 14 between the first inverter 46 and gate 70 of second n-channel transistor 58. Noise filters 16A and 16B are formed by capacitors 72A and 72B connected to ground $V_{SS}$, respectively. The noise filters 16A and 16B are useful for suppressing any voltage spikes in the supply voltage. Other noise filters may be placed in a variety of locations in the power on reset circuit.

In operation, as supply voltage is turned on and increasing supply voltage $V_{DD}$ is applied to voltage divider 11, reference current generator 12, and switching circuit 14. Initially, the voltage Vreset1 formed at first node 55 and the voltage Vreset2 formed at second node 66 track $V_{DD}$, while $V_{DD}$ gradually increases with time. The voltage Vdiv output from voltage divider 11 also increases as $V_{DD}$ increases, but Vdiv=$V_{DD}$/3. Vdiv on node 19 is applied to gate 20 of the first n-channel transistor 22 and Vreset1 on node 55 is applied to gate 70 of second n-channel transistor 58. Both n-channel transistors 22 and 58 are non-conducting until the voltage applied to gates 20 and 70, respectively, reaches the threshold voltage $V_T$.

N-channel transistors 22 and 58 have the same threshold voltage $V_T$, however they do not start conducting simultaneously. Second n-channel transistor 58 conducts first, when $V_{DD}$ rises to a point that causes Vreset1 to exceed $V_T$. The first n-channel transistor 22 is not yet conducting when $V_{DD}$=$V_T$, because the gate voltage of transistor 22 is at $V_{DD}$/3, which is less than $V_T$, and therefore Vreset1 (the voltage applied to second n-channel transistor 58) on node 55 will be approximately equal to $V_{DD}$. The first n-channel transistor 22 conducts later in time when $V_{DD}$ rises to a voltage of approximately $3V_T$, since Vdiv (the voltage applied to first n-channel transistor 22) is equal to $V_{DD}$/3, which equals $V_T$ at this time.

Figure 2A:
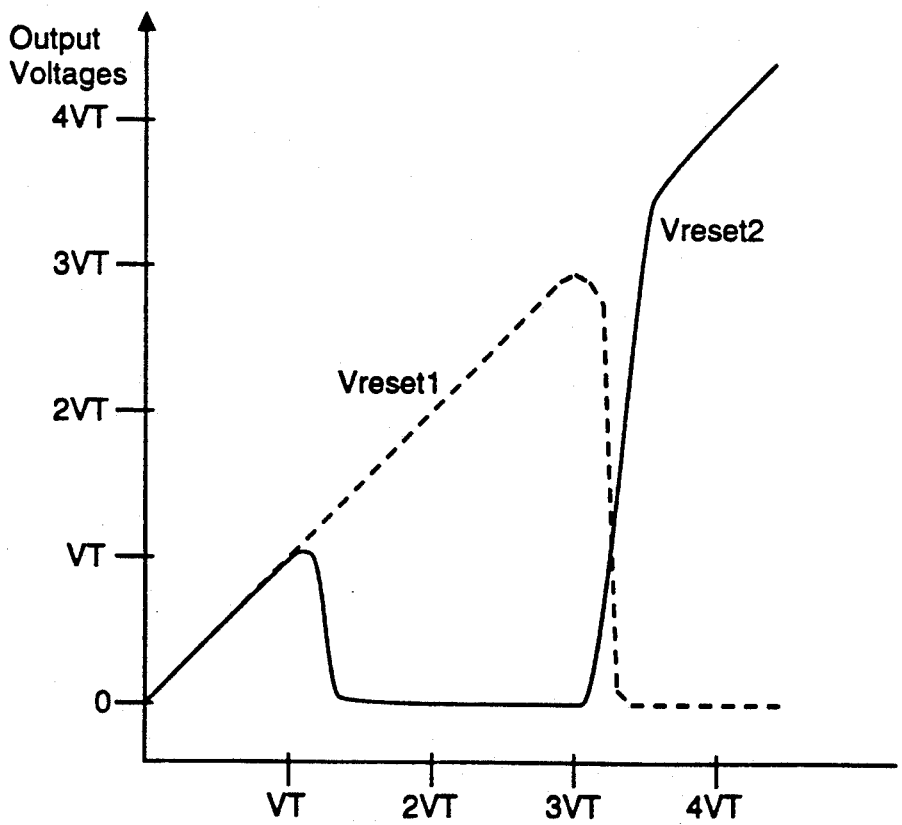
FIGS. 2A and 2B are voltage transfer characteristic diagrams representing actual and ideal operation of the invention, respectively.

FIG. 2A shows Vreset1 and Vreset2 as a function of $V_{DD}$. As shown, until n-channel transistors 22 and 58 are conducting, Vreset1 and Vreset2, respectively, track $V_{DD}$. When $V_{DD}$ reaches $V_T$, Vreset1 will also reach $V_T$ causing second n-channel transistor 58 to start conducting. This causes the second n-channel transistor 58 to sink the current from second current mirror 44. As a result, Vreset2 drops close to zero and remains low as $V_{DD}$ continues to increase, holding the output of the circuit in the reset condition. That is, the integrated circuit is considered to be in a reset condition as long Vreset2 is held low, and that low Vreset2 signal can be used to reset other circuits throughout the integrated circuit in which the power on reset circuit 10 is incorporated. The reset signal, Vreset2, is a negative logic signal that is considered active (or asserted) when it is low.

When $V_{DD}$ reaches $3V_T$, first n-channel transistor 22 starts conducting, since Vdiv is equal to $V_{DD}$/3=$V_T$ (at $V_{DD}$=$3V_T$). This causes transistor 22 to sink the current from first current mirror 40. As a result, Vreset1 (the voltage applied to second n-channel transistor 58) drops close to zero. As Vreset1 falls below $V_T$, the second n-channel transistor 58 stops conducting. Consequently, the current from the second current mirror 44 is no longer pulled down by second n-channel transistor 58, which allows Vreset2 to transition back to $V_{DD}$. Thus, Vreset2 increases sharply, thereby de-asserting the reset signal when, and only when, the supply voltage $V_{DD}$ exceeds a specified voltage level ($3V_T$ in the preferred embodiment).

Figure 2B:
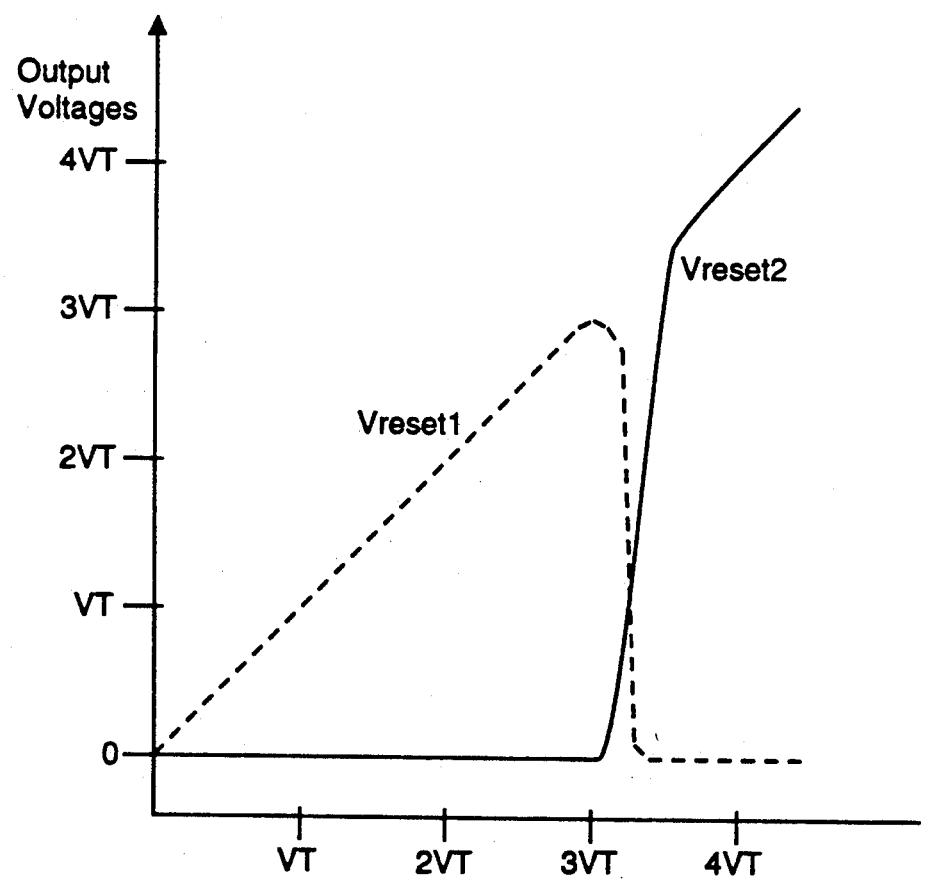

FIGS. 2B shows the ideal sharp voltage transfer function for the reset circuit. In contrast to the actual output voltage Vreset2, there is no increase in the ideal output voltage while $V_{DD}$ increases from 0 to $V_T$. The initial increase in actual output voltage Vreset2 (as shown in FIG. 2A) occurs because second n-channel transistor 58 does not start conducting to pull down second current mirror 44 until $V_{DD}$, and consequently Vreset1, reaches $V_T$.

Although the initial increase in Vreset2's voltage (when 0<$V_{DD}$<$V_T$) is not ideal, most applications are not effected because the initial increase does not reach a high enough voltage to turn on other devices on the same integrated circuit. For example, the reset output Vreset2 on node 66 may be fed to a one-shot circuit 80 which sends out a pulse of predefined duration when Vreset2 has a positive voltage transition reaches a specified voltage level (e.g., $2V_T$). The threshold of the one-shot circuit 80 can be set such that the initial increase in Vreset2 (when 0<$V_{DD}$<$V_T$) does not trigger the one-shot transistor.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A power on reset circuit, comprising:
   a voltage divider coupled to a supply voltage, said voltage divider dividing said supply voltage to generate an output;
   a current reference generator that generates a reference current, said current reference generator including a first current source MOS transistor of a first polarity coupled in series with a first MOS transistor of a second polarity opposite said first polarity; and
   a switching circuit, coupled to said voltage divider and said current reference generator, having a sharply sloped voltage transfer characteristic, said switching circuit including (A) a second current source MOS transistor of said first polarity coupled to said first current source MOS transistor so as to mirror said reference current, and (B) a second MOS transistor of said second polarity gated by said voltage divider output and coupled to said second current source MOS transistor at a first circuit node to draw current from said second current source MOS transistor only when said voltage divider output exceeds a threshold voltage and such that said switching circuit develops a first reset voltage on said first circuit node;

wherein said second MOS transistor of said second polarity is sized large relative to said first MOS transistor of said second polarity so as to produce said sharply sloped voltage transfer characteristic of said switching circuit.

2. The power on reset circuit of claim 1, said switching circuit further including an inverter having an input coupled to said first circuit node and producing a second reset voltage on a second circuit node.

3. A power on reset circuit, comprising:
a voltage divider coupled to a supply voltage, said voltage divider dividing said supply voltage to generate an output;
a current reference generator that generates a reference current, said current reference generator including a first transistor through which said reference current flows; and
a switching circuit, coupled to said voltage divider and said current reference generator, having a sharply sloped voltage transfer characteristic, said switching circuit including (A) a second transistor coupled to said current reference generator so as to mirror said reference current flowing through said first transistor, and (B) a transistor gated by said voltage divider output and coupled to said second transistor at a first circuit node to draw current from said second transistor only when said voltage divider output exceeds a threshold voltage and such that said switching circuit develops a first reset voltage on said first circuit node;
said switching circuit further including an inverter having an input coupled to said first circuit node and producing a second reset voltage on a second circuit node, said inverter comprising a third transistor coupled to said current reference generator so as to mirror said reference current flowing through said first transistor and a transistor gated by said first reset voltage and coupled to said third transistor at said second circuit node to draw current from said third transistor only when said first reset voltage exceeds said threshold voltage.

4. The power on reset circuit of claim 3, further including capacitor means coupled to said voltage divider output and said first circuit node to suppress noise in said voltage supply.

5. The power on reset circuit of claim 3, further including a noise filter coupled to said voltage divider output.

6. A power on reset circuit, comprising:
a voltage divider coupled to a supply voltage, said voltage divider dividing said supply voltage to generate an output;
a current reference generator that generates a reference current, said current reference generator including a first current source MOS transistor of a first polarity coupled in series with a first MOS transistor of a second polarity opposite said first polarity; and
a switching circuit, coupled to said voltage divider and said current reference generator, having a sharply sloped voltage transfer characteristic, said switching circuit including (A) a second current source MOS transistor of said first polarity coupled to said first current source MOS transistor so as to mirror said reference current, and (B) a second MOS transistor of said second polarity gated by said voltage divider output and coupled to said second current source MOS transistor at a first circuit node to draw current from said second current source MOS transistor only when said voltage divider output exceeds a threshold voltage and such that said switching circuit develops a first reset voltage on said first circuit node;

wherein said second MOS transistor of said second polarity is sized large relative to said first MOS transistor of said second polarity so as to produce said sharply sloped voltage transfer characteristic of said switching circuit;

said switching circuit further including an inverter having an input coupled to said first circuit node and producing a second reset voltage on a second circuit node, said inverter comprising a third current source MOS transistor of said first polarity coupled to said current reference generator so as to mirror said reference current flowing through said first current source MOS transistor and a third MOS transistor of said second polarity gated by said first reset voltage and coupled to said third current source MOS transistor at said second circuit node to draw current from said third current source MOS transistor only when said first reset voltage exceeds said threshold voltage.

7. The power on reset circuit of claim 6, further including capacitor means coupled to said voltage divider output and said first circuit node to suppress noise in said voltage supply.

8. The power on reset circuit of claim 6, further including a noise filter coupled to said voltage divider output.

* * * * *